United States Patent [19]
Cullen et al.

[11] Patent Number: 5,159,299
[45] Date of Patent: Oct. 27, 1992

[54] HACT ELECTRODE CONFIGURATION

[75] Inventors: Donald E. Cullen, Manchester; Sears W. Merritt; William J. Tanski, both of Glastonbury; Emilio J. Branciforte, Cromwell, all of Conn.

[73] Assignee: United Technologies Corporation, Hartford, Conn.

[21] Appl. No.: 591,653

[22] Filed: Oct. 2, 1990

[51] Int. Cl.⁵ .................... H03H 9/44; H01L 29/816
[52] U.S. Cl. ................................. 333/152; 333/165; 310/313 R; 357/24
[58] Field of Search ............... 333/150, 152, 153, 154, 333/195, 165; 310/313 R, 313 B, 313 C, 313 D; 357/24

[56] References Cited

U.S. PATENT DOCUMENTS

| | | | |
|---|---|---|---|
| 4,611,140 | 9/1986 | Whitlock et al. | 333/154 X |
| 4,893,161 | 1/1990 | Tanski et al. | 357/24 M |
| 4,994,772 | 2/1991 | Ballato | 333/152 |

OTHER PUBLICATIONS

Merritt et al, "A 3.35 microsecond HACT Transversal fitter", 1989 IEEE Ultrasonics Sysmposium, Oct. 3-6, 1989.

Primary Examiner—Eugene R. LaRoche
Assistant Examiner—Seung Ham

[57] ABSTRACT

A heterostructure acoustic charge transport (HACT) device having a number of signal tap electrodes has revealed unexpected insensitivity to electrode spacing and unexpected sensitivity to electrode width. Spacing of one SAW wavelength between consecutive electrodes and an electrode width of $\lambda/20$ are preferred.

8 Claims, 2 Drawing Sheets

HACT ELECTRODE CONFIGURATION

The Government has rights in this invention pursuant to a contract awarded by the Department of the Army.

DESCRIPTION

1. Technical Field

The field of the invention is that of acoustic charge transport devices and the electrode configurations therefor.

2. Background Art

Early work in acoustic charge transport (ACT) and heterostructure acoustic charge transport (HACT) devices employed simple delay lines in which a single input electrode and a single output electrode were set for some desired time delay.

More complex electrode configurations for more advanced signal processing were contemplated but the art was aware of potential drawbacks. Even though there is no physical transport of electrons from the charge transport layer into the sensing electrodes, there is still potential for modification of the SAW itself and consequent adverse impact on the signals being carried by the electron packets. In particular, a spacing of electrodes at one SAW wavelength would be analogous to a Bragg diffraction grating used in optical devices. The art would expect a considerable amount of reflection of the SAW and other perturbations of the SAW and the electron packets. It would be expected that integral multiples of the SAW wavelength would also give rise to relatively high reflectivity.

Prior work employed electron packets spaced a considerable distance from the surface, which reduced electron perturbation, but decreased the signal coupling to the tap electrodes and decreased the frequency response.

The need for ground electrodes alternating with signal electrodes also was not appreciated by the art.

DISCLOSURE OF THE INVENTION

The invention relates to an electrode configuration for SAW devices in which alternate signal and reference electrodes are spaced by one SAW wavelength. Reflectivity of the SAW is minimized by appropriate fabrication of the individual electrodes.

Other features and advantages will be apparent from the specification and claims and from the accompanying drawings which illustrate an embodiment of the invention.

BEST MODE OF CARRYING OUT THE INVENTION

Figure 1:
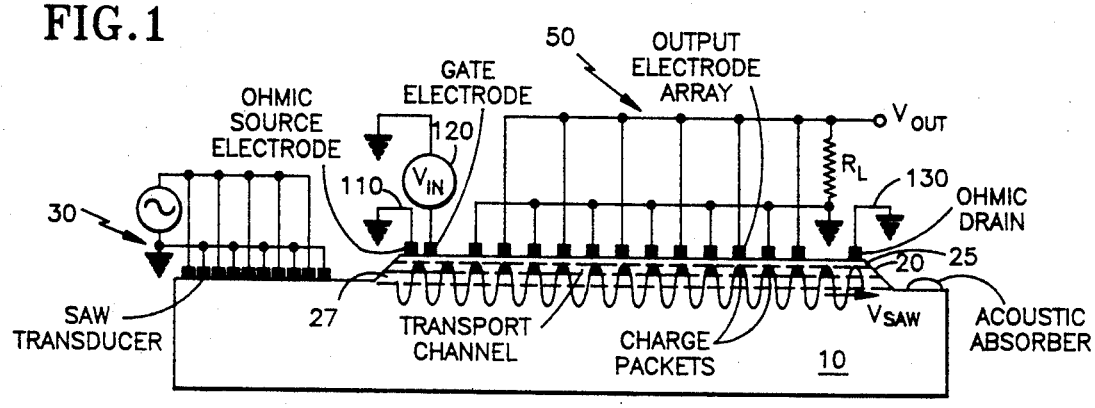
FIG. 1 illustrates an overall view of a SAW device.

Referring now to FIG. 1, there is shown schematically a HACT device in which SAW transducer 30 generates a SAW wave travelling along a charge transport channel within a charge transport layer 20 made of GaAs to the right in the drawing. Charge transport layer 20 lies above charge confinement layer 27 and substrate 10 and below intermediate layer 25, said layers 27 and 25 both being formed from aluminum gallium arsenide (AlGaAs; also written as $Al_xGa_{1-x}As$ or $(Al,Ga)As$. An ohmic source electrode 110 injects electrons into the transport channel where they are picked up by the SAW and carried along in charge packets that are denoted by black shading in the figure. An ohmic drain electrode 130 drains off the charge at the far end of the SAW channel. The subject of the invention is the electrode array denoted generally by the numeral 50 which it is desired to include for advanced signal processing.

Those skilled in the art are aware that the SAW must travel essentially undisturbed or at least with adequate amplitude through the entire electrode array in order to preserve the charge packet integrity and that the reflectivity of the electrodes must be sufficiently low so that this result is achieved. If the SAW amplitude is diminished, then it will not be able to carry the packets or there will be leakage of charge from one packet to an adjacent packet that will degrade the signal. For significant numbers of electrodes, on the order of magnitude of 1,000, and for a SAW frequency $\leq 260$ MHz, the requirement on the charge transfer efficiency (CTE) is very high. An efficiency of 0.999 is considered the threshold for acceptable performance in moderate length arrays (having a transit time of about 2 microseconds) and an efficiency of greater than 0.9999 is considered to be a requirement for very long arrays (about 10 microseconds). There may, of course, be applications which involve a short transport channel in which lower efficiency may be tolerated.

An evident danger is that the electrodes will act in a similar fashion to a Bragg diffraction grating, well known in the integrated circuit and microelectronics fields. These distributed diffraction gratings have spacings of one wavelength and, while each individual perturbation in the index of refraction has a low reflectivity, they accumulate to form reflectivities that are quite substantial. An electrode spacing of one wavelength therefore has an obvious danger.

Another danger that the art was aware of was that an extensive amount of metal in contact with the surface, such as that used in the prior ACT work, will short out the SAW wave at the surface, so that a thick charge transport layer is necessary to get the electrons deep enough in the material so that the SAW is adequate.

In the usual method of construction of ACTs, such as that illustrated in FIG. 1, the electrodes are separated by a fairly large amount from the transport channel. In a conventional ACT, bias electrodes on the surface of the semiconductor are used to direct the electron packets away from the top surface. The electron packets are centered at a depth of $\sim \lambda/4$ and the layer has a thickness of $\sim \lambda/2$. In these prior art devices, the electron packets were relatively resistant to perturbation from the electrodes simply because of distance. The signal coupling efficiency decreases as the electrodes are spaced further away, of course, as does the frequency response of the device. It would be desirable to be able to locate the electrons close to the surface and still have minimal perturbation of the SAW.

No ground or reference electrodes were used in the early work, but the electrodes were able to "see" several charge packets and capacitive coupling to other electrodes connects signals on adjacent electrodes, which degraded the signal response. It has proven necessary for good signal quality to have a ground electrode between the signal electrodes in order to shield the signal electrode from other charge packets and other signal electrodes.

Early ACT work used continuous metal electrodes for charge confinement, so those skilled in the art knew that it was possible to make such devices with a great deal of metal on the surface and were not aware of the sensitivity to the amount of surface area covered by metal that is characteristic of HACT devices.

Figure 2:
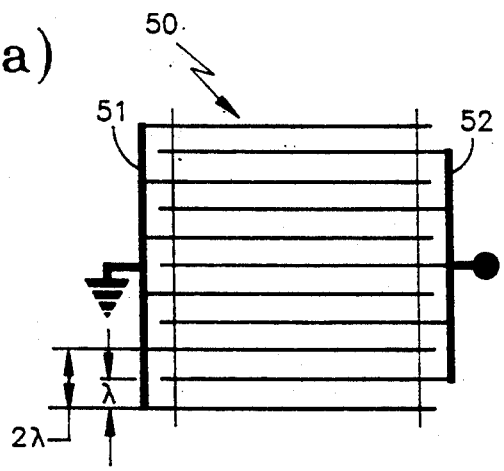
FIG. 2A through 2C illustrate different electrode configurations.
Figure 2:
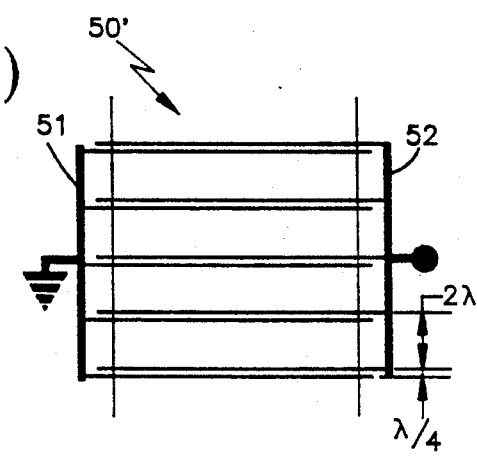
Figure 2:
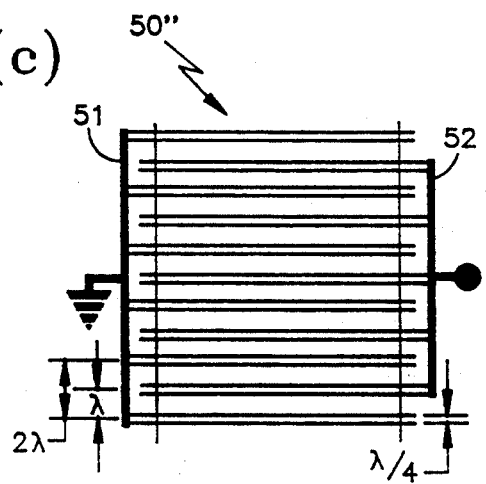

Referring now to FIG. 2, there is shown in FIG. 2A a schematic of an electrode array 50 in which a set of signal tap electrodes 52 are spaced at intervals of $2\lambda$ and these electrodes alternate with an array 51 of reference electrodes which are at ground potential so that a set of signal electrodes and a set of reference electrodes alternate with a spacing of $\lambda$. These two sets of electrodes will be connected to a load as shown in FIG. 1. The load may be a simple resistor or it may be a differential amplifier.

Figure 3:
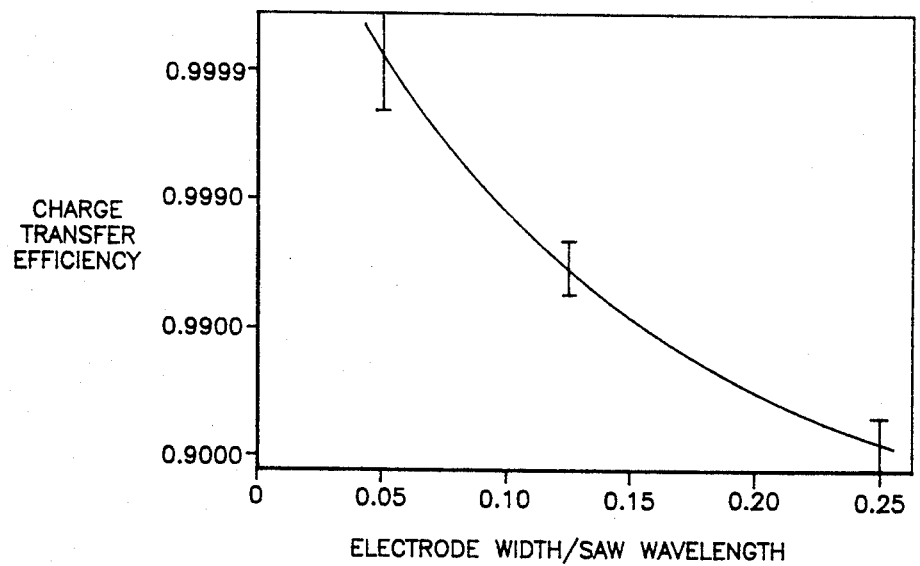
FIG. 3 illustrates a graph of charge transfer efficiency for a SAW device.

Referring now to FIG. 3, there is shown a graph of charge transfer efficiency versus electrode width for a HACT having the electrode surface about 100 nm from the transport channel. The prior art had used electrode widths of $\lambda/4$ which gave a CTE of 0.9000. This is considered unacceptable for the applications intended. An electrode width of $\lambda/8$ is the dividing point for acceptable operations. It has been found that there is an unexpected sensitivity to the electrode width, rather than the electrode thickness or the type of metal in the electrode. In order to achieve the desired objective of 0.9999 CTE, it is necessary to shrink the electrode to a value of $\lambda/20$. There will be a tradeoff between low perturbation and device yield, of course, since thin electrodes are more likely to have defects. The preferred device width will decrease in time as fabrication technology improves. At the present, a width of 1 micron is a practical limitation of fabrication technology, which puts an effective frequency limit of less than 300 MHz on the SAW, for typical device parameters.

The prior art $\lambda/4$ electrodes had employed a triple layer electrode comprising a layer of titanium deposited on the semiconductor surface by electron beam deposition followed by a layer of aluminum and a top layer of titanium. This configuration bonded very well to the semiconductor and was resistant to further processing steps because of the inertness of titanium.

The electrode configurations of FIG. 2b and FIG. 2c were investigated in the hope that closely spaced pairs of electrodes having a group spacing of $2\lambda$ and a subgroup spacing of $\lambda/4$ would have a lower reflectivity for the SAW. This configuration will be referred to as the anti-reflection configuration because the space of $\lambda/4$ between electrodes results in a phase difference of $\lambda/2$ between reflections from those electrodes, so the reflections should cancel out. This was the case, but unexpectedly, the CTE was excessively low, being less than 0.99. A third variation in FIG. 2c was the same as that of FIG. 2b, but having dual electrodes spaced by $\lambda/4$ for both signal and ground electrodes. It also had poor CTE.

These electrode configurations, while having the minimum perturbation to the SAW, still did perturb the electron packets being carried by the forward-going SAW. The effect was to dislodge electrons from one packet which would then drift over and be picked up by a following packet, resulting in degradation of the signal.

Tests of different electron widths and materials resulted in a choice of a single layer of aluminum having a width of $\lambda/20$ (1 micron in the illustrative devices operating at a SAW frequency of 144 MHz) and a thickness of 30 nm. A set of values of metallization and resistance on a test sample of 1 micron wide lines is shown in Table 1. It can be seen that the resistivity of the electrodes declines sharply between 20 nm and 30 nm and thereafter decreases slowly.

It should be understood that the invention is not limited to the particular embodiments shown and described herein, but that various changes and modifications may be made without departing from the spirit and scope of this novel concept as defined by the following claims.

TABLE 1

ELECTRODE RESISTANCE VALUES FOR ONE MICRON LINES

| | METALLIZATION SEQUENCE | RESISTANCE (Ohms) |
|---|---|---|
| A | 10 nm Ti—20 nm Al—10 nm Ti | 1300 |
| B | 5 nm Ti—10 nm Al—5 nm Ti | 5000 |
| C | 20 nm Al | 1300 |
| D | 30 nm Al | 700 |
| E | 40 nm Al | 600 |
| F | 50 nm Al | 450 |

We claim:

1. A heterostructure acoustic charge transport device having a charge transport layer of one composition having a top surface and being disposed above a charge confinement layer of a second composition, for carrying charge packets along a channel axis in said charge transport layer from a source electrode to a drain electrode under the influence of a SAW generated by a SAW transducer, said SAW having a predetermined SAW wavelength $\lambda$;

a device surface, carrying said source and drain electrodes and a set of signal electrodes, said signal electrodes being divided into a signal set and a reference set, disposed in alternation on said surface with a differential spacing therebetween of substantially $\lambda$; and said set of signal electrodes have an electrode width along said channel axis of less than $\lambda/8$.

2. A heterostructure acoustic charge transport device according to claim 1, in which said device surface is said top surface of said charge transport layer.

3. A heterostructure acoustic charge transport device according to claim 1, in which said one composition is GaAs and said second composition is (Al,Ga)As.

4. A heterostructure acoustic charge transport device according to claim 1, in which at least one intermediate layer of said second composition is interposed between said device surface and said top surface of said charge transport layer.

5. A heterostructure acoustic charge transport device according to claim 4, in which said one composition is GaAs and said second composition is (Al,Ga)As.

6. A heterostructure acoustic charge transport device including a charge transport layer having a top surface and being disposed above a substrate, for carrying charge packets along a channel axis in said charge transport layer from a source electrode to a drain electrode under the influence of a SAW having a predetermined SAW wavelength $\lambda$;

a device surface, carrying said source and drain electrodes and a set of signal electrodes, said signal electrodes being divided into a signal set and a reference set, disposed in alternation on said surface with a differential spacing therebetweeen of substantially $\lambda$; and said set of signal electrodes have an electrode width along said channel axis of less than $\lambda/8$.

7. A heterostructure charge transport device according to claim 6, in which said device surface is said top surface of said charge transport layer.

8. A heterostructure charge transport device according to claim 6, in which an intermediate layer is interposed between said device surface and said top surface of said charge transport layer.

* * * * *